(12) United States Patent
Gregory

(10) Patent No.: US 6,735,371 B2
(45) Date of Patent: May 11, 2004

(54) OPTICAL FIBRE CONNECTOR

(75) Inventor: Jason Ellis Gregory, Bury St Edmunds (GB)

(73) Assignee: Agilent Technologies, Inc., Palo Alto, CA (US)

(*) Notice: Subject to any disclaimer, the term of this patent is extended or adjusted under 35 U.S.C. 154(b) by 0 days.

(21) Appl. No.: 10/316,885

(22) Filed: Dec. 12, 2002

(65) Prior Publication Data

US 2003/0112599 A1 Jun. 19, 2003

(30) Foreign Application Priority Data

Dec. 13, 2001 (EP) .............................. 01310416

(51) Int. Cl.⁷ .............................................. G02B 6/00
(52) U.S. Cl. ...................................................... 385/134
(58) Field of Search ........................ 4385/53, 55, 134, 4385/137, 139; 439/607–610

(56) References Cited

U.S. PATENT DOCUMENTS

| 5,031,027 A | 7/1991 | Dorinski et al. |
| 5,216,581 A | 6/1993 | Fisher et al. |
| 5,434,747 A * | 7/1995 | Shibata .................... 439/607 X |
| 6,299,487 B1 * | 10/2001 | Lopata et al. ............... 439/610 |

FOREIGN PATENT DOCUMENTS

| EP | 0 288 808 A2 | 11/1988 |
| EP | 0 386 279 A1 | 9/1990 |

OTHER PUBLICATIONS

Japanese Patent Abstract, vol. 006, No. 176 of Publication No. 57 091573 A, Dated Jun. 7, 1982.

* cited by examiner

Primary Examiner—Son V. Nguyen

(57) ABSTRACT

An optical fibre connector is moulded into a planar metallic body that is manipulated into a cuboid to form an rf-shielded optical connector.

13 Claims, 4 Drawing Sheets

OPTICAL FIBRE CONNECTOR

FIELD OF INVENTION

This invention relates to the field of optical fibre connectors and in particular optical fibre connectors with radio-frequency shielding.

BACKGROUND ART

Optical fibre transmission systems have become ubiquitous in high-capacity trunk network routes. These systems have extremely high data transport capacities over a small number of optical fibres and thus the cost of some system components has not been critical. As optical fibre transmission systems expand into local network routes and even into the local loop, a larger number of optical fibres will be used to transport smaller volumes of data. In this scenario, the relative cost of some tasks, for example connecting optical fibres to devices such as light sources and detectors, will increase significantly. Therefore there is a demand for an optical connector that can be manufactured economically and that is simple to construct and install.

SUMMARY OF THE INVENTION

According to a first aspect of the invention an optical fibre connector assembly comprises a substantially planar metallic body and a plastics moulding that comprises an optical connector. Preferably, the substantially planar metallic body can be manipulated into a substantially cuboidal form, and the optical connector is located on the exterior of the body.

The simple structure of the assembly enables economic manufacture of the assembly and subsequent construction and installation of the assembly.

When constructed, the substantially metallic assembly provides radio frequency shielding for the components installed within the assembly. The substantially planar metallic body can include one or more apertures. These apertures advantageously allow some airflow to occur in order to provide some thermal cooling and optionally to enable the application of solvents to clean the interior of a constructed assembly. Furthermore, the provision of apertures in the region of the body surrounding the optical connector facilitates the formation of the plastics moulding.

According to a second aspect of the invention there is provided a method of manufacturing an optical fibre connector assembly. The method comprises the step of moulding an optical connector on a substantially planar metallic body. Advantageously, the method may comprise the further step of manipulating the body into a substantially cuboidal form such that the optical connector is located on the exterior of the body. The simple construction method provides an inexpensive optical connector that is quick to assemble.

The invention will now be described, by way of example only, with reference to the following Figures.

DETAILED DESCRIPTION OF THE DRAWINGS

Figure 1:
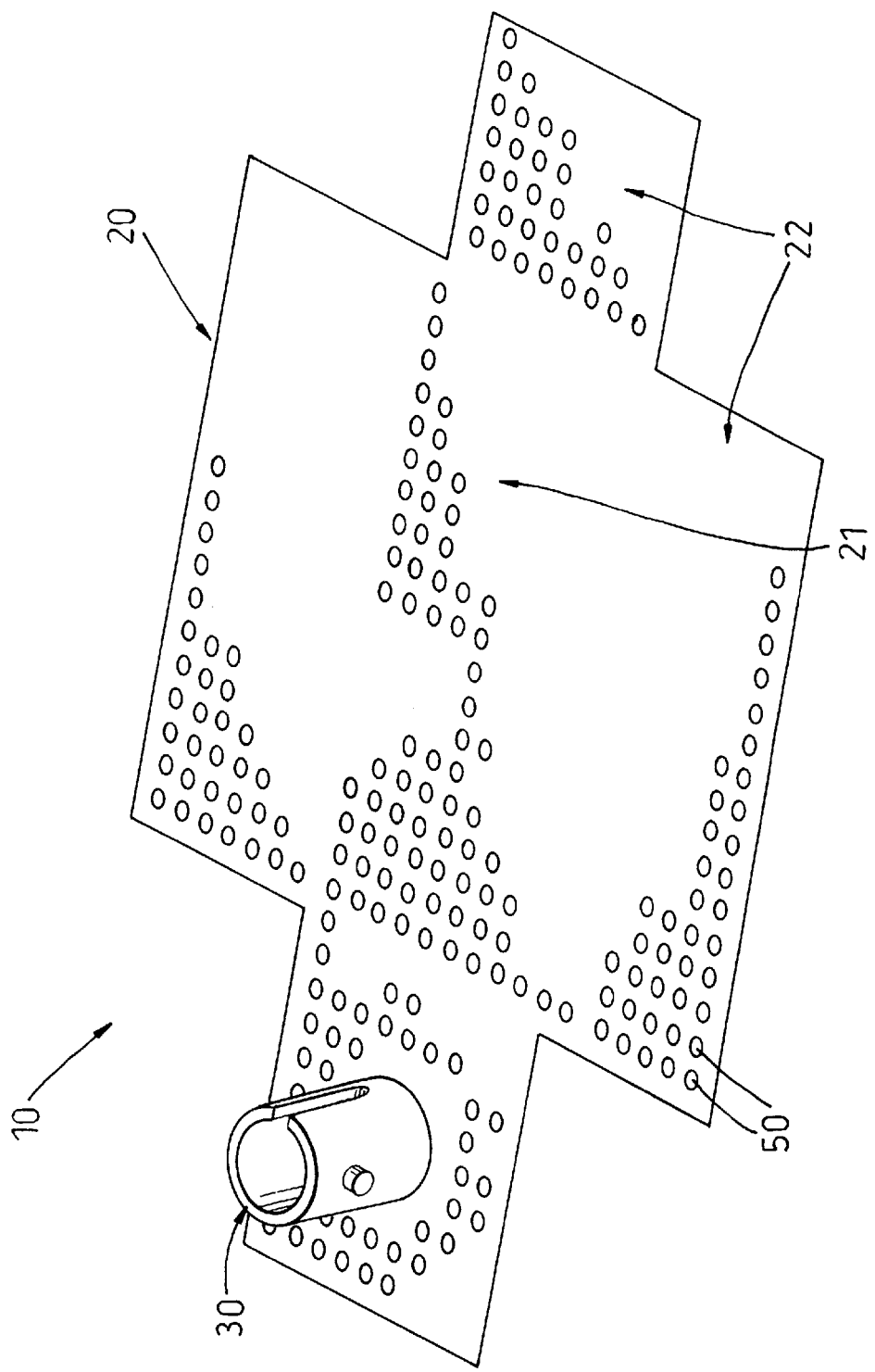
FIG. 1 is a schematic depiction of an optical fibre connector assembly according to a preferred embodiment of the present invention.

FIG. 1 is a schematic depiction of an optical fibre connector assembly according to the present invention. The assembly 10 comprises a substantially planar body 20, and a polymeric moulding 30 which comprises an optical connector 30. The body is made from a metal, preferably a cupro-nickel alloy, or nickel-plated brass. The body comprises an aperture (not shown) within which the optical connector is formed.

The polymeric moulding is made using standard inset moulding techniques to form an optical connector 30 that can receive connectorised optical fibres. These techniques involve a metallic body being held within a mould, into which liquid polymer is injected. The application in which the connector is to be used will determine the precision required of the moulded connector. For a 'low quality' connector that would be suitable for use with, for example, plastic optical fibre, then the connector must be made with to tolerances of a few tens of microns. For more demanding applications, for example using multi-mode optical fibre, then tolerances of 5–10 $\mu$m will be required, whilst 'high quality' connectors, suitable for use with single-mode fibres for example, require tolerances of 1 micron (or less). In order to provide the tolerances required for these 'high-quality' connectors it may be necessary to add high precision alignment inserts to be moulded within the connector. Such inserts may be made from, for example, a liquid crystal polymer. It is believed that the present invention may be more effective at producing low and medium quality connectors.

It is a requisite for the material used to form the moulding that it is mechanically strong and reasonably rigid and has a thermal expansion coefficient that is compatible with the metallic body. A suitable polymer is PEK (polyetherketone) and is thought that some nylon material would be suitable. Polyethylene, polypropylene and ABS have been found to be unsuitable for use as the moulding material. It is only necessary to align the optical connector with respect to the metallic body to within approximately 100 $\mu$m.

The moulded connector may be of any type, for example ST, SC, FC/PC, etc., and be suitable for connecting single mode fibres, multimode fibres or plastic optical fibres.

The body additionally comprises a number of small holes 50 through which the molten polymer will flow during the moulding process to form the optical connector 30. The size, and number, of the holes is a trade-off between the rf-shielding capability of the connector body and the capacity of molten polymer that can flow through the holes. Experimentation has found that holes approximately 1 mm in diameter enable the connector body (when assembled) to provide rf-shielding into the Gbit/s range.

Preferably, the body is substantially cruciform in shape so that flange regions 22 can be folded around the central region 21 to form a box-like structure which is open on one face. It will be readily understood that different shaped planar bodies could be used, leading to folded assemblies that have non-rectangular cross-sections.

Figure 2:
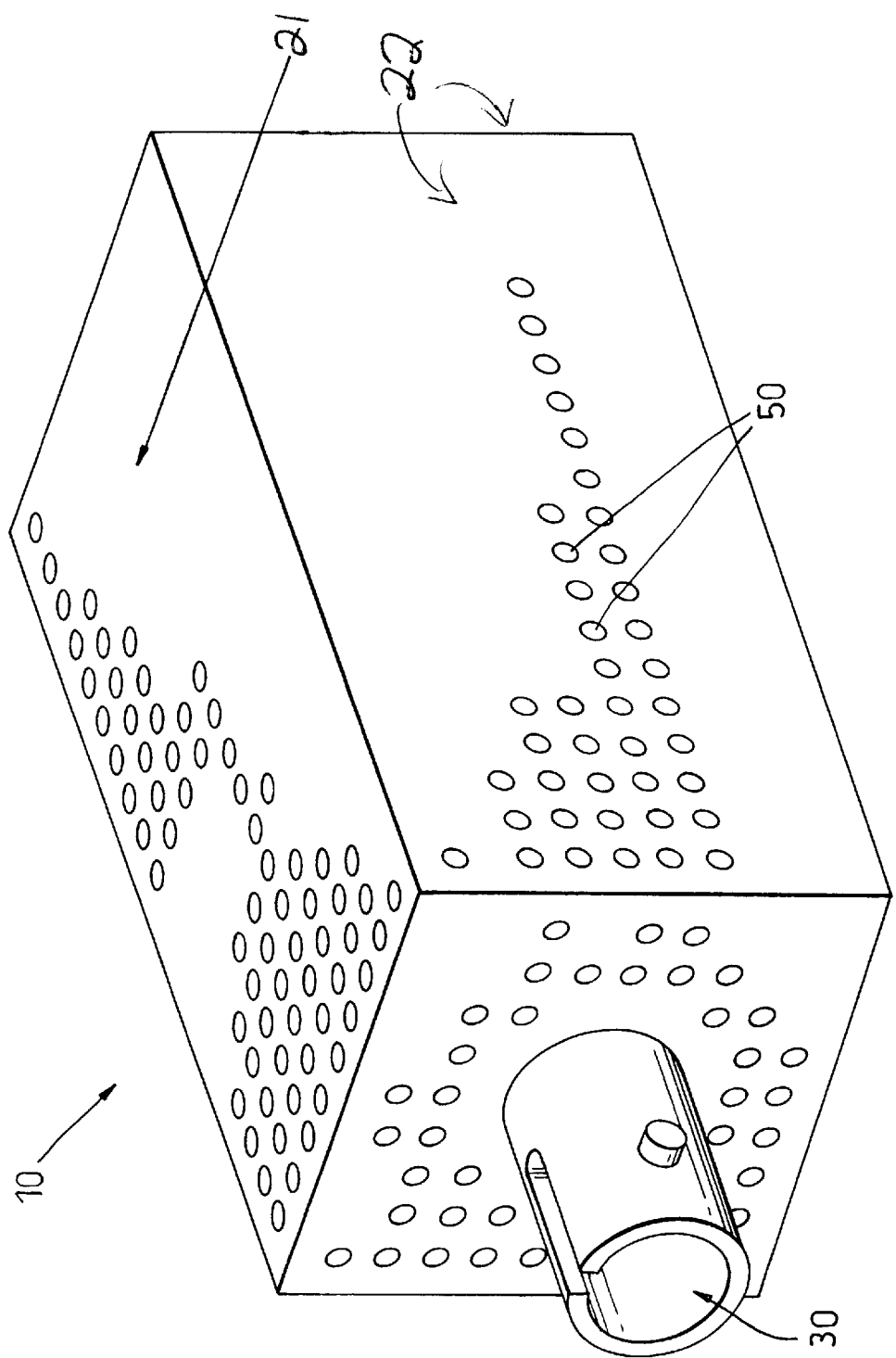
FIG. 2 is a further schematic depiction of an optical fibre connector assembly according to another preferred embodiment of the present invention.

FIG. 2 is an illustration of such a box-like structure which has been formed such that the central region 21 of FIG. 1 forms the top of the assembly.

The optical fibre connector assembly is designed to be coupled to an optical device, for example an optical transmitter (such as a laser diode or LED), an optical receiver or an integrated optical transceiver, and to present an optical connector such that a connectorised optical fibre can be optically coupled with the optical device.

Figure 3:
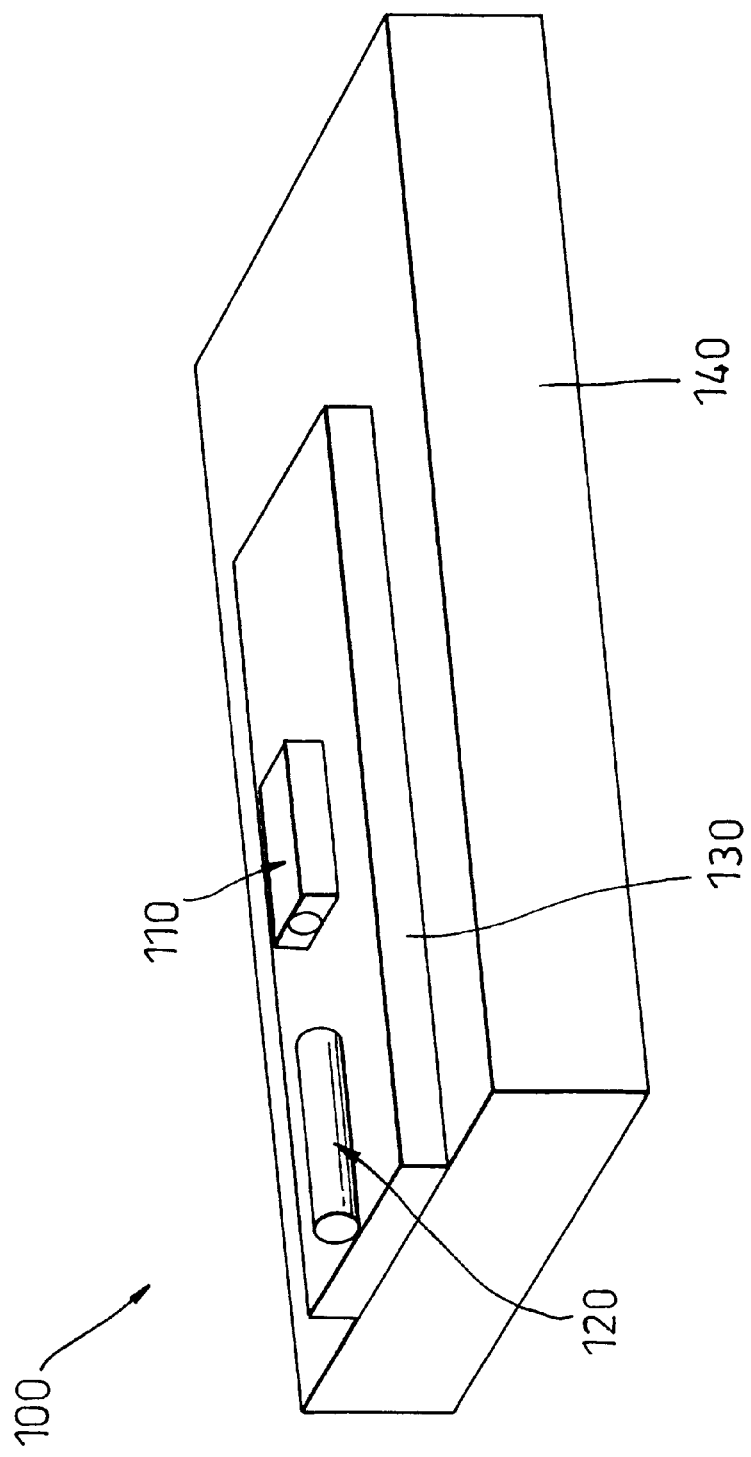
FIG. 3 is a schematic depiction of an optical device assembly to which the assembly of FIG. 1 or 2 can be coupled; and, FIG. 4 is a schematic depiction of a further embodiment of another preferred embodiment of an optical fibre connector assembly according to the present invention.

FIG. 3 is a schematic depiction of an optical device assembly 100 to which an optical connector assembly according to the present invention can be coupled. The optical device assembly 100 comprises an optical device 110, an optical waveguide 120, a substrate 130 and a base 140. The length and width of the substrate 130 are such that they are substantially equal to the height and width of the open plane of the folded optical connector assembly such that a folded optical connector assembly can be placed around the substrate. The height of the substrate is such that the optical waveguide 120 is aligned with the optical connector 30 held within the folded optical connector assembly. The optical device 110 is aligned with the optical waveguide 120 such that light launched from the optical device 110 will be coupled into the optical connector 30 (and hence will be coupled into an optical fibre that is connected to the optical connector) and light that is launched from the optical connector 30 (that is, light launched from an optical fibre into the optical connector) will be coupled into the optical device 110. The base would typically comprise a PCB or similar, but the base may be metallised in order to increase the rf shielding provided by the base. Standard techniques for focussing optical outputs can be employed in order to increase the efficiency of the optical coupling.

Figure 4:
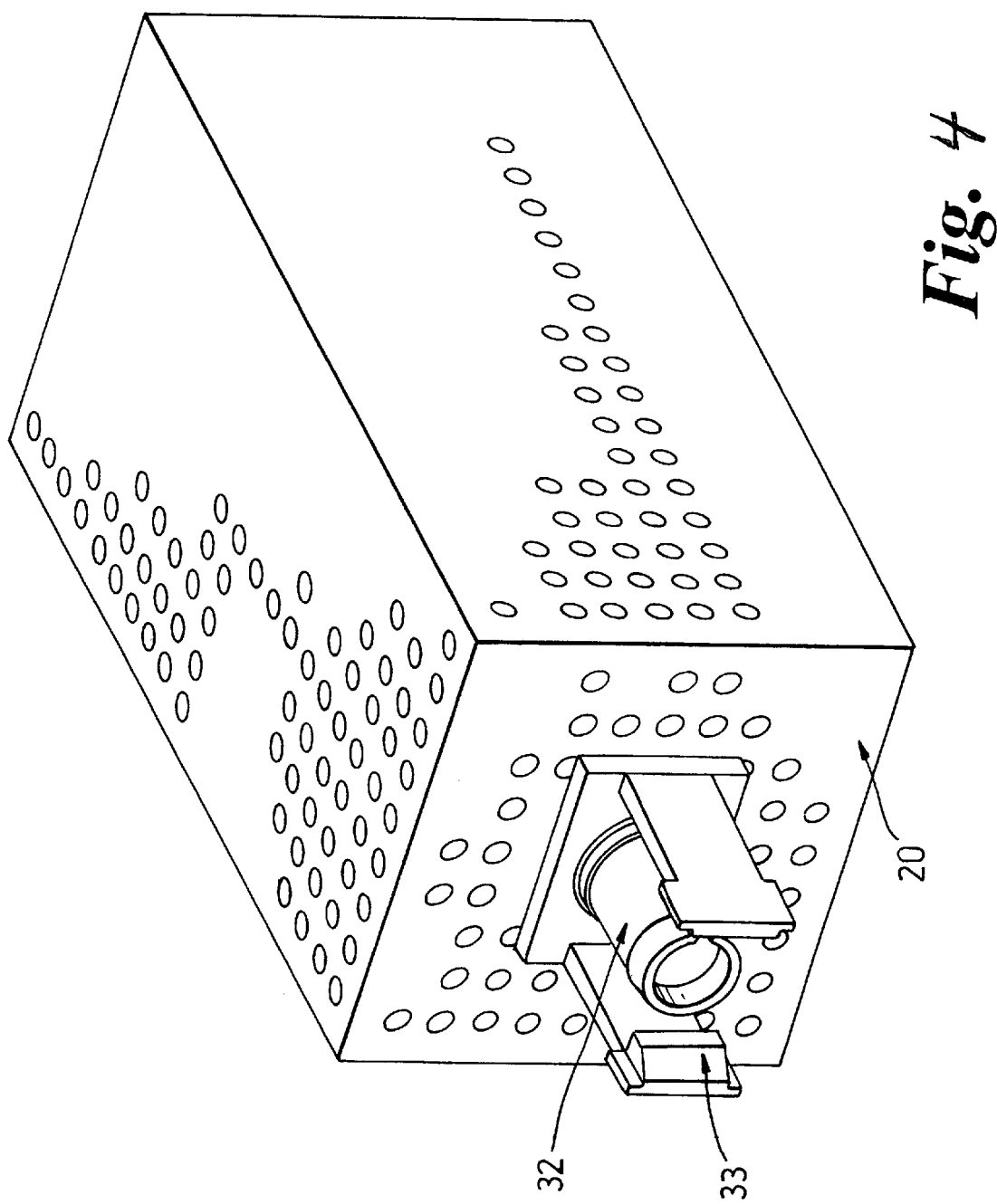

FIG. 4 is a schematic depiction of a further embodiment of the present invention. FIG. 4 is a perspective view of the assembled connector. The moulding comprises a second hollow cylindrical section 32 and engagement means 33 such that a conventional connector (not shown) can receive the cylindrical section 32 and make a physical connection with the engagement means.

What is claimed is:

1. An optical fibre connector assembly comprising a substantially planar metallic body having a plurality of flow-through holes disposed therein and a plastic moulding, the plastic moulding including an optical connector, the substantially planar metallic body being capable of being manipulated into a substantially cuboidal form, the optical connector being located on the exterior of the metallic body.

2. An optical fibre connector assembly according to claim 1, in which the plurality of flow-through holes are circular and approximately 1 millimeter in diameter.

3. A method of manufacturing an optical fibre connector assembly, the method comprising the steps of:

flowing molten polymer over a substantially planar metallic body having a plurality of flow-through holes disposed therein, moulding an optical connector to the substantially planar metallic body, and manipulating the body into a substantially cuboidal form in such a way that the optical connector molded to the body is located on the exterior of the body.

4. A method of manufacturing an optical fibre connector assembly, the method comprising the steps of:

forming an optical connector on a substantially planar metallic body located in a mold having a cavity with a shape corresponding with the shape of the connector by flowing a molten polymer in the mold and through flow-through holes in the metallic body; and then manipulating the planar body with the connector molded to it into a box in such a way that the optical connector molded to the body is located on the exterior of the box.

5. The method of claim 4 wherein the holes have a geometry to enable the metallic box to provide RF shielding between the interior and exterior of the box.

6. An optical fibre connector assembly comprising a metallic box, the metallic box covered by a polymer and having flow-through holes for the polymer in molten form, the polymer forming an optical connector molded to the exterior of the box, the holes having a geometry to enable the metallic box to provide RF shielding between the interior and exterior of the box.

7. The apparatus of claim 6 wherein the holes have a circular shape and a diameter of about 1 millimeter to provide RF shielding into the gigabyte per second range.

8. The apparatus of claim 7 wherein the box includes fold lines at the edges thereof resulting from a substantially planar sheet being folded into the box.

9. The apparatus of claim 6 wherein the box includes fold lines at the edges thereof resulting from a substantially planar sheet being folded into the box.

10. The apparatus of claim 6 wherein the metallicbox is made from a cupro-nickel alloy or nickel plated brass and the polymer is polyether-ketone or a nylon having a thermal expansion coefficient compatible with the metallic body.

11. The apparatus of claim 10 wherein the holes have a circular shape and a diameter of about 1 millimeter to provide RF shielding into the gigabyte per second range.

12. The apparatus of claim 11 wherein the metallic box includes fold lines at the edges thereof resulting from a substantially planar sheet being folded into the box.

13. The apparatus of claim 10 wherein the metallic box includes fold lines at the edges thereof resulting from a substantially planar sheet being folded into the box.

* * * * *